United States Patent
Lee

(10) Patent No.: US 8,158,528 B2
(45) Date of Patent: Apr. 17, 2012

(54) METHOD FOR FORMING PATTERN OF SEMICONDUCTOR DEVICE

(75) Inventor: Sung Koo Lee, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 488 days.

(21) Appl. No.: 12/493,055

(22) Filed: Jun. 26, 2009

(65) Prior Publication Data

US 2010/0099261 A1  Apr. 22, 2010

(30) Foreign Application Priority Data

Oct. 16, 2008  (KR) ........................ 10-2008-0101563

(51) Int. Cl.
 *H01L 21/302* (2006.01)
 *H01L 21/461* (2006.01)
(52) U.S. Cl. ......................................... 438/725; 216/47
(58) Field of Classification Search ................... 438/725; 216/47
 See application file for complete search history.

(56) References Cited

U.S. PATENT DOCUMENTS

| | | | |
|---|---|---|---|
| 5,750,680 A | 5/1998 | Kim et al. | |
| 6,051,678 A | 4/2000 | Kim et al. | |
| 6,132,926 A | 10/2000 | Jung et al. | |
| 6,143,463 A | 11/2000 | Jung et al. | |
| 6,150,069 A | 11/2000 | Jung et al. | |
| 6,180,316 B1 | 1/2001 | Kajita et al. | |
| 6,225,020 B1 | 5/2001 | Jung et al. | |
| 6,235,447 B1 | 5/2001 | Lee et al. | |
| 6,235,448 B1 | 5/2001 | Lee et al. | |
| 6,383,952 B1 * | 5/2002 | Subramanian et al. | 438/781 |
| 2005/0118755 A1 * | 6/2005 | Lin et al. | 438/197 |
| 2008/0187845 A1 | 8/2008 | Van Haren et al. | |

* cited by examiner

*Primary Examiner* — Roberts Culbert

(57) ABSTRACT

A method for forming a pattern of a semiconductor device comprises: forming a stacked film including an underlying layer, an antireflection film and a photoresist film over a semiconductor substrate; coating an over-coating composition over the photoresist film to form an over-coating film; performing an exposing and developing process with a cell mask on the photoresist film where the over-coating film is formed to form a photoresist pattern; forming a silicon-containing-RELACS layer over the antireflection film including the photoresist pattern where the over-coating film is formed; removing the over-coating film and the silicon containing RELACS layer on the photoresist pattern to form a spacer of the silicon containing RELACS layer at sidewalls of the photoresist pattern; removing the photoresist pattern; and etching the antireflection film and the underlying layer with the spacer of the silicon containing RELACS layer as a mask to form an antireflection pattern and an underlying pattern.

15 Claims, 8 Drawing Sheets

METHOD FOR FORMING PATTERN OF SEMICONDUCTOR DEVICE

CROSS-REFERENCE TO RELATED APPLICATION

The priority of Korean patent application No. 10-2008-0101563 filed Oct. 16, 2008, the disclosure of which is hereby incorporated in its entirety by reference, is claimed.

BACKGROUND OF THE INVENTION

The present invention generally relates to a method for forming a pattern of a semiconductor device, and, more specifically, to a method for forming an ultra fine pattern using a spacer patterning technology to overcome resolution limits of an exposer used in the manufacture of semiconductor devices.

In order to improve integration of the semiconductor device, a photolithography technology has been developed. The photolithography technology can form fine patterns using Deep Ultra Violet (DUV) light sources, such as, ArF (193 nm) and VUV (157 nm), and chemically amplified photoresist materials suitable for the exposer light sources.

As a semiconductor device becomes smaller, it is important to control a critical dimension of a pattern line-width in the photolithography technology. Generally, the processing speed of semiconductor devices depends on the critical dimension of the pattern line-width. For example, when the size of the pattern line-width is decreased, the processing speed is increased to improve device performance.

However, in the photolithography process, it is difficult to form a line and space (L/S) pattern of less than 40 nm by a single exposure process using an ArF exposer having a common numerical aperture of less than 1.2.

In order to improve resolution of a photolithography technology and extend a process margin, a double exposure technology has been developed. The double exposure technology includes processes whereby a photoresist-coated wafer is exposed twice using two masks, and then developed.

Since the double exposure technology uses two masking processes for patterning, the process is complicated in comparison with the case using a single mask, and the manufacturing cost and the turn-around-time are greater than those of a single patterning technology using a single mask, thereby degrading the throughput. When a pattern having a smaller pitch than a resolution limit of the exposer is formed in the cell region, illusory images are overlapped. As a result, the double exposure technology may not result in a desired pattern. Furthermore, during alignment of the masks, overlays may be misaligned.

In order to prevent the overlapping and misalignment, i) a double patterning technology (DPT) and ii) a spacer patterning technology (SPT) have been used.

The DPT comprises forming a first pattern having a pitch twice as large as that of a desired pattern, and forming a second pattern having the same pitch, but between the first patterns. The DPT may use two different methods to form the pattern: a positive method or a negative method.

As shown in FIG. 1, in the positive method, a stacked structure including an underlying layer 12, a first hard mask film 14, a second hard mask film 16 and a first positive photoresist pattern 18a is formed over a semiconductor substrate 10. A second hard mask pattern 16a is formed using the first positive photoresist pattern 18a as an etching mask. A second positive photoresist pattern 18b is formed in between the second hard mask patterns 16a. A first hard mask pattern 14a is formed using the second hard mask pattern 16a and the second positive photoresist pattern 18b as etching masks.

As shown in FIG. 2, in the negative method, a stacked structure including an underlying layer 22, a first hard mask film 24, a second hard mask film 26 and a first negative photoresist pattern 28a is formed over a semiconductor substrate 20. A second hard mask pattern 26a is formed using the first negative photoresist pattern 28a as an etching mask. A second negative photoresist pattern 28b is formed over the second hard mask pattern 26a. The second hard mask pattern 26a is etched using the second negative photoresist pattern 28b as an etching mask. The second negative photoresist pattern 28b is removed, and the first hard mask film 24 is etched using the second hard mask pattern 26a as an etching mask to form a first hard mask pattern 24a.

Since the DPT methods use two separate masking processes, it is possible to form a pattern having a smaller pitch size. However, the process steps are complicated, and the manufacturing cost is increased. Moreover, when the second photoresist pattern is formed, misalignment can occur.

The SPT is a self-alignment technology for preventing misalignment by using spacers for forming a pattern in a cell region. The SPT may be performed two different ways: a positive method or a negative method.

As shown in FIG. 3, in the positive method, a stacked structure including an underlying layer 32, a first hard mask film 34, a second hard mask film 36 and a photoresist pattern 38a is formed over a semiconductor substrate 30. A second hard mask pattern 36a is formed using the first photoresist pattern 38a as an etching mask. A spacer 38b is formed at sidewalls of the second hard mask pattern 36a. The second hard mask pattern 36a is removed, and a first hard mask pattern 34a is formed using the spacer 38b as an etching mask.

As shown in FIG. 4, in the negative method, a stacked structure including an underling layer 42, a first hard mask film 44, a second hard mask film 46 and a photoresist pattern 48a is formed over a semiconductor substrate 40. A second hard mask pattern 46a is formed using the photoresist pattern 48a as an etching mask. A spacer 48b is formed at sidewalls of the second hard mask pattern 46a. A spin-on-glass film 50 is coated over the resulting structure. A CMP or an etch-back method is performed to expose the second hard mask pattern 46a. The spacer 48b is removed, and a first hard mask pattern 44a is formed using the second hard mask pattern 46a and the spin-on-glass film 50 as etching masks.

FIG. 5 is a cross-sectional diagram illustrating a conventional SPT method. A stacked structure including an underlying layer 32, a first hard mask film 34 and a second hard mask pattern 36a (e.g., amorphous carbon) is formed over a semiconductor substrate 30.

A chemical vapor deposition (CVD) method is performed on the first hard mask film 34 including the second hard mask pattern 36a, creating a nitride film 38. The nitride film 38 is etched by an etch-back process, thereby obtaining a spacer 38b at sidewalls of the second hard mask pattern 36a.

The second hard mask pattern 36a is removed. A polysilicon film included in the top layer of the first mask films 34 is etched using the spacer 38b as an etching mask, thereby forming a first hard mask pattern 34a. The spacer 38b is removed.

As mentioned above, since a nitride film is formed by a CVD method and a multi-layered mask film is applied in order to form a spacer in the conventional SPT method, the etching process is repeated several times. As a result, the process is complicated, the manufacturing cost is high, and the process time is long. Moreover, the operation of CVD equipment is complicated. Furthermore, after an etch-back process, a horn shape can be formed on the spacer (i.e., impurities that have attached to the spacer). As the critical dimension of the spacer becomes smaller, the pattern profile can be degraded by this horn shape.

BRIEF SUMMARY OF THE INVENTION

Various embodiments of the invention are directed to providing a method for forming a fine pattern of a semiconductor device that comprises forming a Resolution Enhancement Lithography Assisted by Chemical Shrink (RELACS) layer by a spin-on-coating method in a track equipment in order to form a spacer according to a SPT method, forming an over-coating film for inhibiting generation of acids over a photoresist pattern, inducing a cross-linking reaction between the RELACS layer and sidewalls of the photoresist pattern to obtain a spacer, and patterning the spacer used as a mask.

According to an embodiment of the present invention, a method for forming a pattern of a semiconductor device comprises: forming a stacked film including an underlying layer, an antireflection film and a photoresist film over a semiconductor substrate; coating an over-coating composition over the photoresist film to form an over-coating film; performing an exposing and developing process with a cell mask on the photoresist film where the over-coating film is formed to form a photoresist pattern; forming a silicon containing RERALCS layer over the antireflection film including the photoresist pattern where the over-coating film is formed; removing the over-coating film and the silicon containing RELACS layer on the photoresist pattern to form a spacer of the silicon containing RELACS layer at sidewalls of the photoresist pattern; removing the photoresist pattern; and etching the antireflection film and the underlying layer with the spacer of the silicon containing RELACS layer as a mask to form an antireflection pattern and an underlying pattern.

Preferably, the over-coating composition comprises: a polymer including a repeating unit induced from (meth) acrylic acid ester having a fluorine containing alkyl group and a repeating unit induced from (meth)acrylic acid ester having an adamantyl group; an organic solvent; and a photoacid generator.

Preferably, the over-coating film has a thickness ranging from 400 to 1000 Å.

Preferably, the silicon containing RELACS layer includes hydrogen silsesquoxane (HSQ) as a base resin.

Preferably, the silicon containing RELACS layer contains silicon present in an amount ranging from 15 to 45 wt %.

Preferably, the silicon containing RELACS layer is formed by a spin on coating method.

Preferably, the forming-a-silicon-containing-RELACS-layer includes a baking process performed at a temperature ranging from 100 to 190° C.

Preferably, the silicon containing RELACS layer has a thickness ranging from 800 to 1500 Å.

Preferably, the spacer has a width ranging from 15 to 20 nm.

Preferably, the removing-the-photoresist-pattern is performed with an $O_2$ plasma.

Also, a semiconductor device comprises a pattern formed by the above-described methods.

DESCRIPTION OF EMBODIMENTS

FIGS. 6a to 6g are cross-sectional diagrams illustrating a method for forming a pattern of a semiconductor device according to an embodiment of the present invention.

Figure 1:
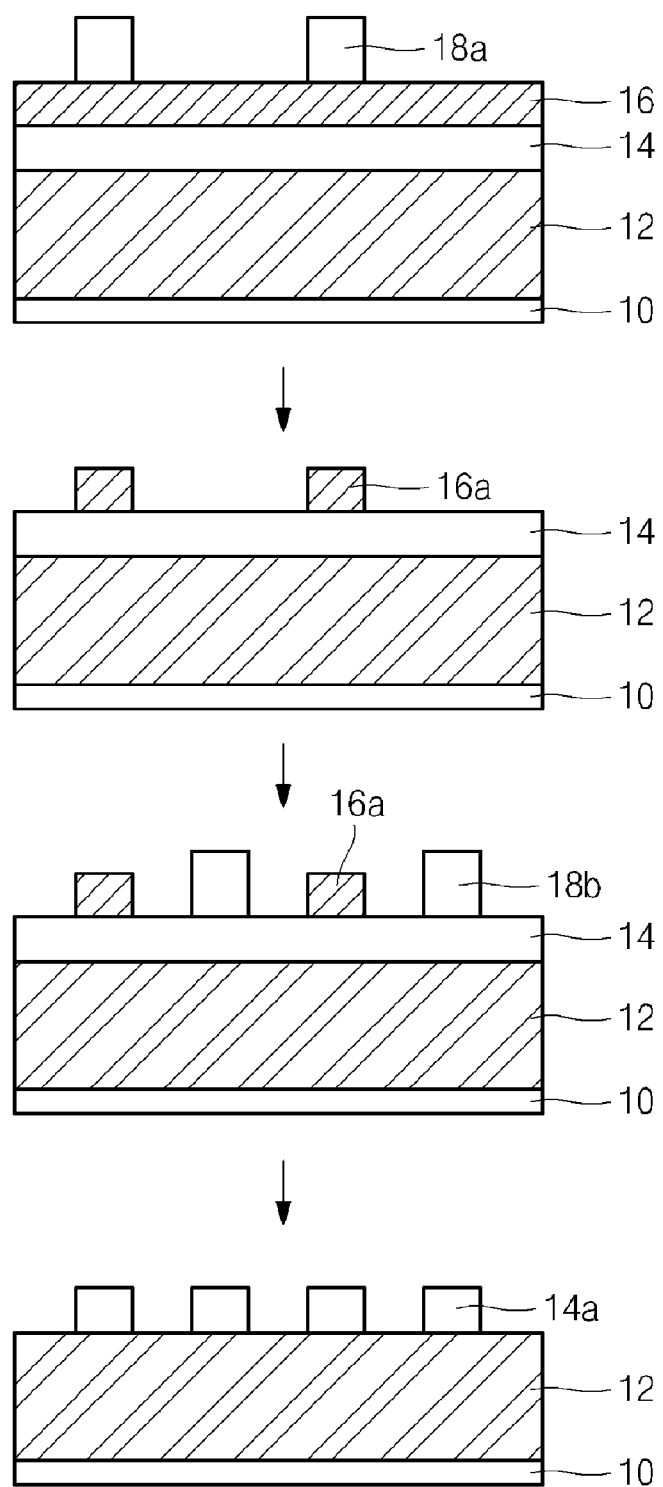
FIG. 1 is a cross-sectional diagram illustrating a conventional positive double patterning method.
Figure 2:
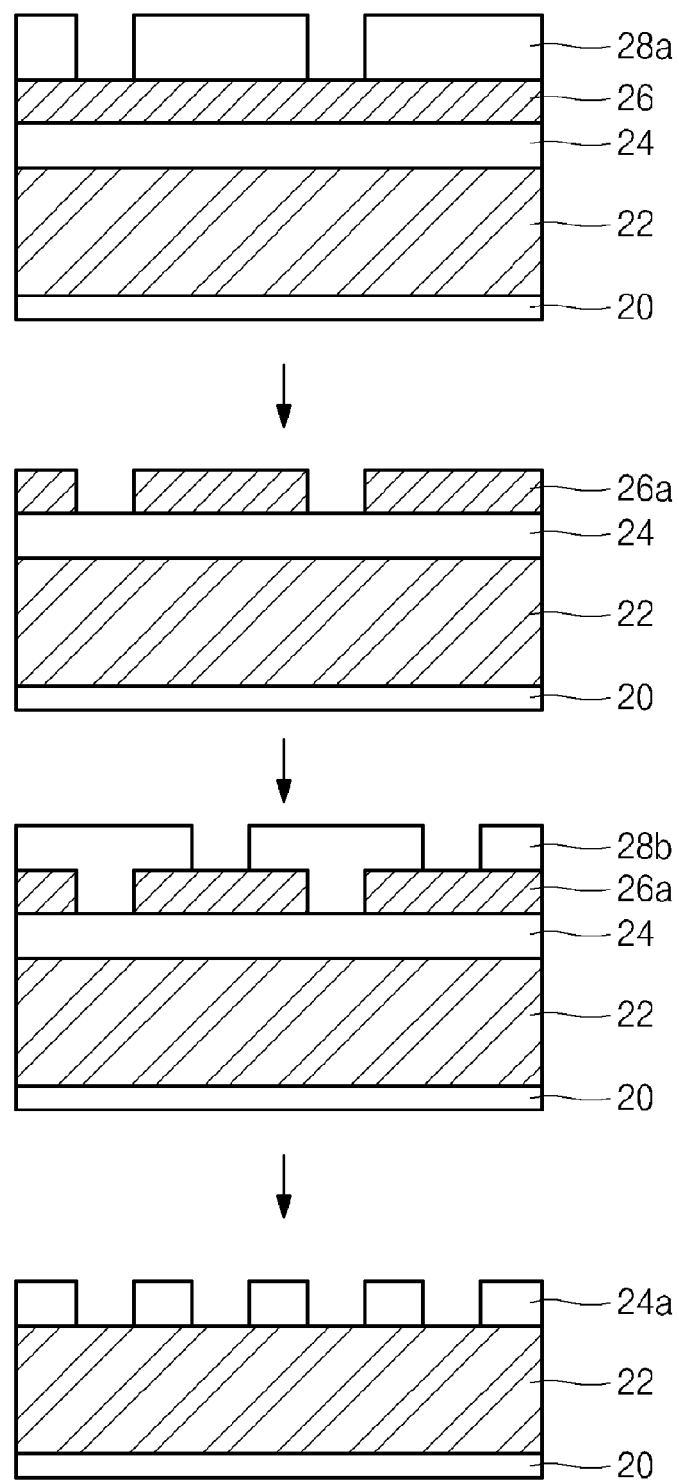
FIG. 2 is a cross-sectional diagram illustrating a conventional negative double patterning method.
Figure 3:
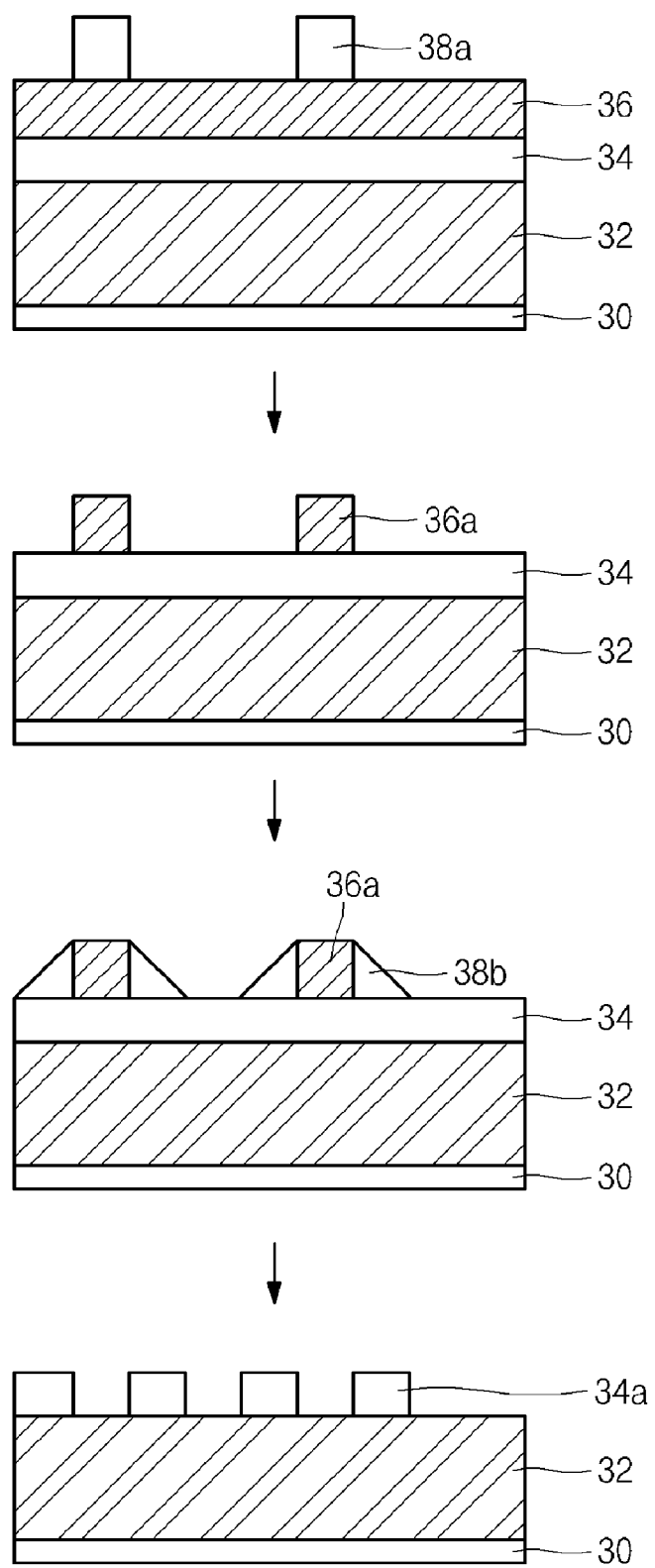
FIG. 3 is a cross-sectional diagram illustrating a conventional positive spacer patterning method.
Figure 4:
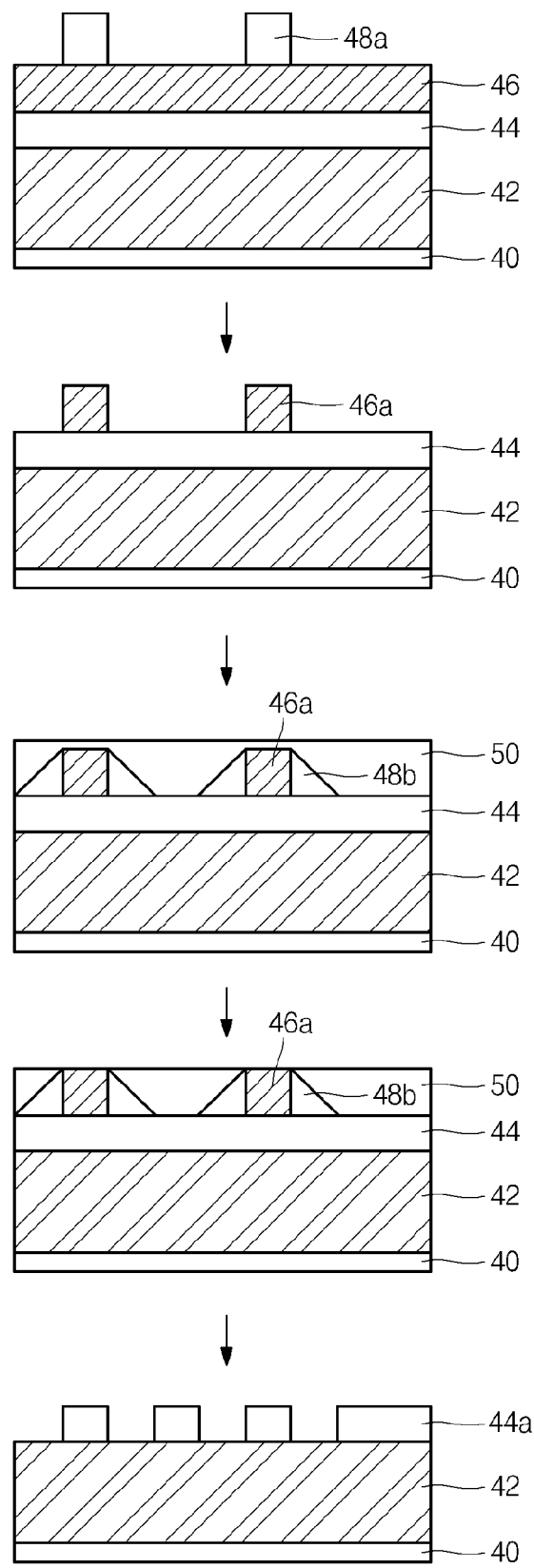
FIG. 4 is a cross-sectional diagram illustrating a conventional negative spacer patterning method.
Figure 5:
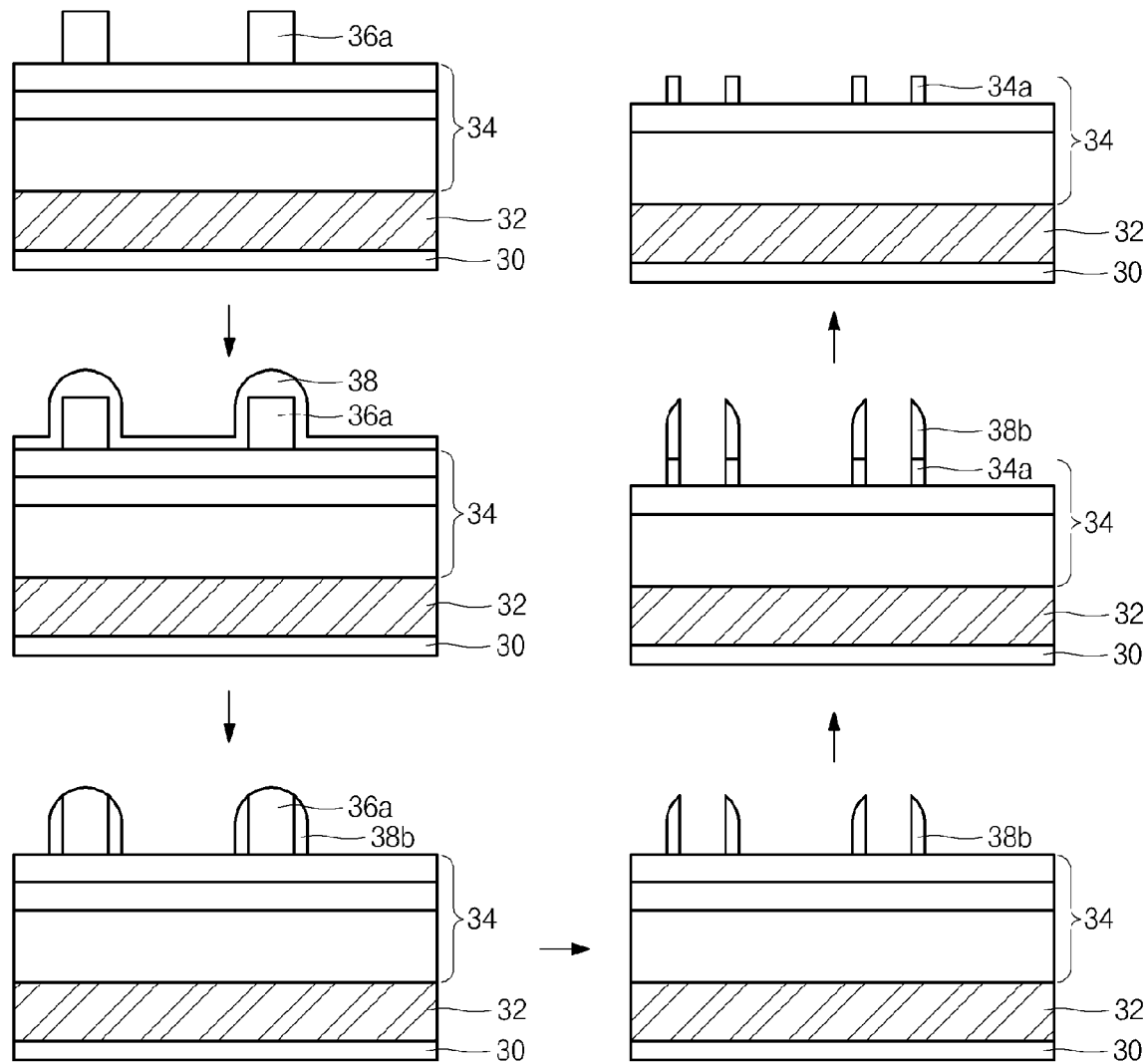
FIG. 5 is a cross-sectional diagram illustrating a conventional spacer patterning method.
Figure 6A:
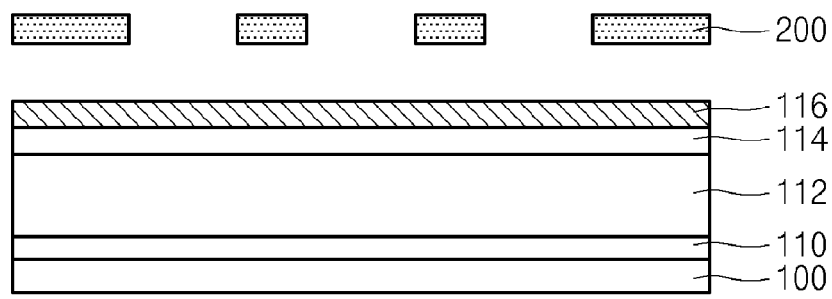
FIGS. 6a to 6g are cross-sectional diagrams illustrating a method for forming a pattern of a semiconductor device according to an embodiment of the present invention.

Referring to FIG. 6a, a deposition film including an underlying layer (or target layer) 110 and an antireflection film (or antireflective film) 112 having a thickness ranging from 200 to 250 Å is formed over a semiconductor substrate 100. A chemically-amplified photoresist composition of a positive or negative type is spin-coated over the antireflection film 112, and baked to obtain a photoresist film 114 having a thickness ranging from 900 to 1200 Å.

Suitable chemically-amplified photoresist composition is disclosed in U.S. Pat. No. 5,750,680 (May 12, 1998), U.S. Pat. No. 6,051,678 (Apr. 18, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) or U.S. Pat. No. 6,235,447 B1 (May 22, 2001), the respective disclosures of which are incorporated by reference herein. The chemically-amplified photoresist composition may include a photoacid generator, an organic solvent, and a base resin including one or more of polyvinylphenol, polyhydroxystyrene, polynorbornene, polyadamantyl, polyimide, polyacrylate, polymethacrylate and polyfluorine.

The base resin includes a polymer such as: of ROMA-type polymers comprising of substituted maleic anhydride as a polymerization repeating unit; COMA-type polymers comprising of cycloolefin, maleic anhydride, methacrylate and acrylate as polymerization repeating units; and combinations thereof.

An over-coating composition is coated over the photoresist film 114, and baked at a temperature ranging from 130 to 200° C. for 30~200 seconds, thereby forming an over-coating film 116 that has a thickness ranging from 400 to 1000 Å.

The over-coating composition includes a polymer [including a repeating unit induced from (meth)acrylic acid ester having a fluorine containing alkyl group and a repeating unit induced from (meth)acrylic acid ester having an adamantyl group]; an organic solvent; and a photoacid generator. Specifically, the polymer may include a repeating unit of 2,2,3, 4,4,4-hexafluorobutyl methacrylate and a repeating unit of 2-methyladamantyl methacrylate.

The photoacid generator is present in an amount ranging from 0.005 to 0.2 parts by weight based on 100 parts by weight of the polymer. The organic solvent is present in an amount ranging from 1000 to 6000 parts by weight based on 100 parts by weight of the polymer.

A specific method for obtaining the over-coating composition is as follows.

Fifteen grams (15 g) of 2,2,3,4,4,4-hexafluorobutyl methacrylate, 25 g of 2-methyladamantyl methacrylate and 0.8 g of 2,2'-azobisisobutyronitrile are dissolved in 200 g of propyleneglycol methyl etheracetate (PGMEA). The resulting mixture is reacted at 68° C. for 24 hours.

After reaction, precipitates obtained from normal hexane are vacuum-dried to obtain poly(2,2,3,4,4,4-hexafluorobutyl methacrylate/2-methyladamantyl methacrylate).

Into 10 g of the poly(2,2,3,4,4,4-hexafluorobutyl methacrylate/2-methyladamantyl methacrylate), 0.05 g of triphenylsulfonium nonafluorobutyl sulfonate is dissolved as a photoacid generator and 120 g of PGMEA is dissolved as an organic solvent. The resulting mixture is filtered with a 0.05 μm filter to obtain the over-coating composition.

Figure 6B:
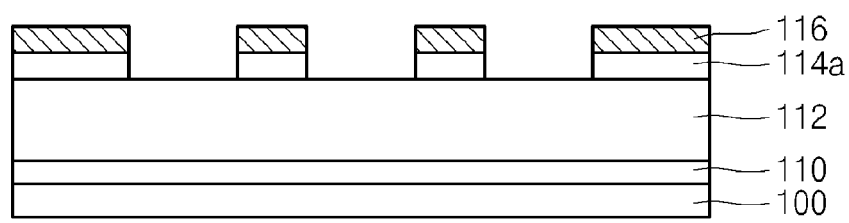

Referring to FIG. 6b, an exposing and developing process is performed using a cell mask 200 on the photoresist film 114 where the over-coating film 116 is formed, thereby forming a photoresist pattern 114a.

Since the over-coating film 116 is formed over the photoresist film 114, acid generated on the photoresist film 114 is prevented from being exposed to air during the exposing process.

Figure 6C:
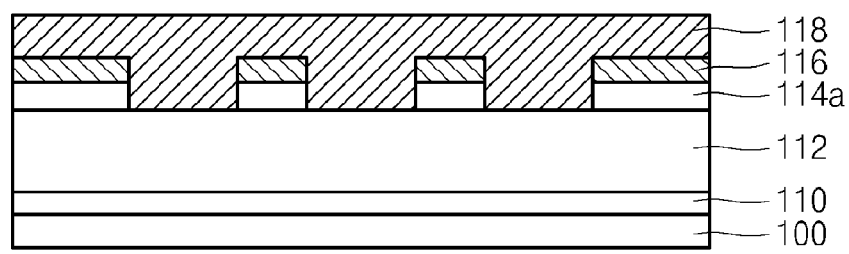

Referring to FIG. 6c, silicon-containing-RELACS material is coated over the antireflection film 112, the photoresist pattern 114a and the over-coating film 116. The resulting structure is baked (or heated) at 100~190° C., preferably 110~170° C. for 90 seconds, thereby forming a silicon-containing-RELACS layer 118 having a thickness ranging from 800 to 1500 Å.

The silicon-containing-RELACS material is coated using a spin-on-coating method.

As used herein, the RELACS material refers to materials that are suitable for use in a RELACS process. One such RELACS material is produced by AZ Electronic Materials Company. The RELACS process has been used recently to reduce the size of a contact hole. For example, a photoresist pattern is formed on a semiconductor substrate. The RELACS material is coated over the photoresist pattern, and baked to cause a cross-linking reaction between the RELACS material and the photoresist pattern. As a result, a space between the photoresist patterns is reduced so that the contact hole size becomes smaller.

The silicon-containing RELACS material may include hydrogen silsesquoxane (HSQ) as a base resin. The silicon-containing-RELACS layer contains silicon in an amount ranging from 15 to 45 wt %.

In one embodiment, the RELACS layer 118 is formed using AZ Exp. SA310 which is a silicon-containing-RELACS-material produced by AZ Electronic Materials Company. The RELACS layer 118 has an excellent etching resistance and enhances the etching selectivity.

When the silicon-containing-RELACS layer 118 is formed, the type of RELACS materials and the baking temperature can be adjusted depending on the amount of RELACS used. As a result, it is possible to adjust a line-width of a spacer formed in a subsequent process to a desired size.

Figure 6D:
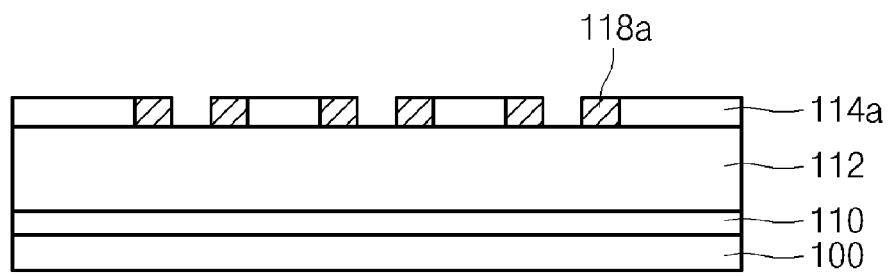

Referring to FIG. 6d, the over-coating film 116 and the silicon-containing-RELACS layer 118 over the photoresist pattern 114a are removed with a thinner or a developer.

In the baking process, a cross-linking reaction occurs between the silicon-containing-RELACS layer 118 and sidewalls of the photoresist pattern 114a on which no over-coating film 116 is formed. As a result, the silicon-containing-RELACS layer 118 disposed at the sidewalls of the photoresist pattern 114a is not removed by the subsequent removing process so that a spacer 118a having a width ranging from 15 to 20 nm is formed.

However, acid generated on the photoresist pattern 114a is prevented from penetrating into the RELACS layer 118 due to the presence of the over-coating film 116. Thus, the cross-linking reaction does not occur between the silicon-containing-RELACS layer 118 and the upper portion of the photoresist pattern 114a. As a result, the silicon-containing-RELACS layer 118 disposed over the photoresist pattern 114a is removed by the removing process.

Although the over-coating film 116 includes a photoacid generator, the amount present therein is not sufficient to cause significant the cross-linking reaction to occur between the silicon-containing-RELACS layer 118 and the over-coating film 116. The over-coating film 116 is removed by a thinner or a developer.

As a result, the method of the present invention does not require an etch-back process for removing the silicon-containing-RELACS layer 118 disposed over the photoresist pattern 114a when the spacer is formed, thereby simplifying the process.

Figure 6E:
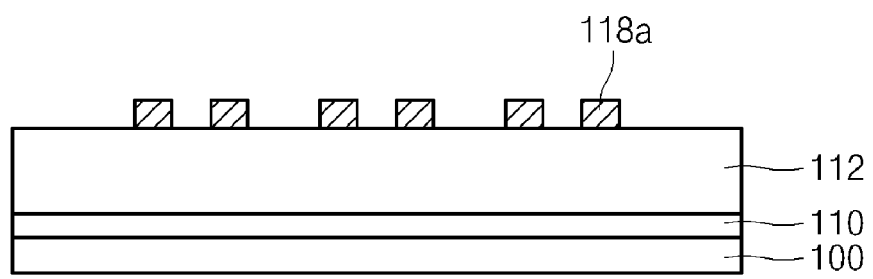

Referring to FIG. 6e, the photoresist pattern 114a is removed with an $O_2$ plasma.

Figure 6F:
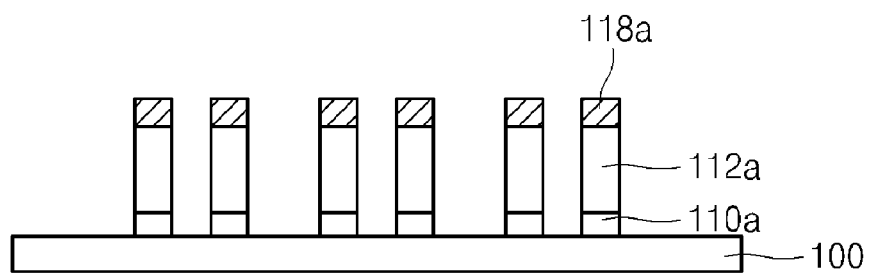

Referring to FIG. 6f, the antireflection film 112 and the underlying layer 110 are etched using the spacer 118a as a mask to form an antireflection pattern 112a and an underlying pattern 110a.

Figure 6G:
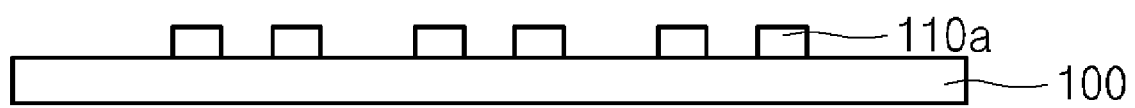

Referring to FIG. 6g, the spacer 118a and the antireflection pattern 112a are removed to obtain the underlying pattern 110a.

As described above, the method of the present invention utilizes a simple SPT process including a spin-on-coating method that can be performed by a photolithography process, thereby simplifying the process and reducing the manufacturing cost and time. Also, it is simple to adjust a width of a spacer by an $O_2$ plasma method. That is, the amount of cross-linked RELACS (e.g., the width) may be adjusted by a baking temperature, the type of RELACS material and the type of photoresist material.

Also, the method of the present invention does not require an etch-back process to form a spacer, thereby preventing the spacer from being damaged.

Moreover, the method of the present invention utilizes a SPT process employing a single exposure process, thereby preventing misalignment in comparison with a double exposure process.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a pattern of a semiconductor device, the method comprising:
    forming a stacked film including an underlying layer, an antireflective film and a photoresist film over a substrate;
    forming an over-coating film over the photoresist film;
    patterning the photoresist film and the over-coating film to form a stack pattern of a photoresist pattern and an over-coating film pattern, the stack pattern exposing portions of the antireflective film;
    forming a silicon-containing-RELACS layer over the antireflective film and the stack pattern;
    removing the over-coating film and a portion of the-silicon-containing-RELACS layer to form a spacer, the spacer being a portion of the silicon-containing-RELACS layer remaining at sidewalls of the photoresist pattern;

removing the photoresist pattern; and etching the antireflective film and the underlying layer using the spacer as a mask to form an antireflection pattern and an underlying pattern.

2. The method according to claim 1, wherein the overcoating composition comprises: a polymer including a repeating unit induced from (meth)acrylic acid ester having a fluorine containing alkyl group and a repeating unit induced from (meth)acrylic acid ester having an adamantyl group; an organic solvent; and a photoacid generator.

3. The method according to claim 2, wherein the polymer includes a repeating unit of 2,2,3,4,4,4-hexafluorobutyl methacrylate and a repeating unit of 2-methyladamantyl methacrylate.

4. The method according to claim 1, wherein the overcoating film has a thickness ranging from 400 to 1000 Å.

5. The method according to claim 1, wherein the silicon containing RELACS layer includes hydrogen silsesquoxane (HSQ) as a base resin.

6. The method according to claim 1, wherein the silicon-containing-RELACS layer contains silicon in an amount ranging from 15 to 45 wt %.

7. The method according to claim 1, wherein the silicon-containing-RELACS layer is formed by a spin-on-coating method.

8. The method according to claim 1, wherein the forming-a-silicon-containing-RELACS-layer includes a baking process performed at a temperature ranging from 100 to 190° C.

9. The method according to claim 1, wherein the silicon-containing-RELACS layer has a thickness ranging from 800 to 1500 Å.

10. The method according to claim 1, wherein the spacer has a width ranging from 15 to 20 nm.

11. The method according to claim 1, wherein the removing-the-photoresist-pattern is performed using $O_2$ plasma.

12. A method for forming a pattern of a semiconductor device, the method comprising:

forming a coating film over a photoresist film, the photoresist film being provided over an antireflective film, the antireflective film being provided over an underlying layer;

patterning the coating film and the photoresist film to expose portions of the antireflective film;

forming a silicon-containing-RELACS layer over the antireflective film and the patterned coating film, the silicon-containing-RELACS layer contacting the patterned photoresist film, so that a portion of the silicon-containing-RELACS layer experiences a cross-linking reaction with the photoresist film;

removing the silicon-containing-RELACS layer other than the portion that experienced the cross-linking reaction with the photoresist film to form a spacer;

removing the photoresist pattern; and etching the antireflective film and the underlying layer using the spacer as a mask to form an antireflection pattern and an underlying pattern.

13. The method of claim 12, wherein forming the silicon-containing-RELACS layer includes:

providing silicon-containing-RELACS material over the antireflective film and the patterned coating film; and heating the silicon-containing-RELACS material to obtain a desired thickness.

14. The method of claim 13, wherein the silicon-containing-RELACS material is heated at a temperature of no more than 190° C.

15. The method of claim 13, wherein the silicon-containing-RELACS material is baked at a temperature of no more than 190° C.

* * * * *